United States Patent
Chien (10) Patent No.: US 7,468,629 B2
(45) Date of Patent: Dec. 23, 2008

(54) TUNING CIRCUIT FOR TRANSCONDUCTORS AND RELATED METHOD

(75) Inventor: Chih-Chang Chien, Taipei Hsien (TW)

(73) Assignee: VIA Technologies Inc., Tsin-Tien, Taipei Hsien (TW)

( * ) Notice: Subject to any disclaimer, the term of this patent is extended or adjusted under 35 U.S.C. 154(b) by 0 days.

(21) Appl. No.: 11/467,564

(22) Filed: Aug. 28, 2006

(65) Prior Publication Data

US 2007/0096798 A1    May 3, 2007

(30) Foreign Application Priority Data

Oct. 28, 2005    (TW) .............. 94137839 A (51) Int. Cl.
  *H03K 5/00* (2006.01)
(52) U.S. Cl. .................. 327/553; 327/552; 327/554
(58) Field of Classification Search ......... 327/551–559, 327/536–537
See application file for complete search history.

(56) References Cited

U.S. PATENT DOCUMENTS

| 5,117,205 | A | * | 5/1992 | Nauta | 331/117 FE |
|---|---|---|---|---|---|
| 5,594,383 | A | * | 1/1997 | Tamba | 327/552 |
| 5,625,317 | A | * | 4/1997 | Deveirman | 327/553 |
| 5,745,001 | A | * | 4/1998 | Ueshima et al. | 327/553 |
| 6,122,416 | A | * | 9/2000 | Ooba et al. | 385/16 |
| 6,504,436 | B2 | | 1/2003 | Horikawa | |
| 6,600,373 | B1 | | 7/2003 | Bailey | |
| 6,806,776 | B2 | | 10/2004 | Lee | |
| 6,838,929 | B2 | * | 1/2005 | Mitteregger | 327/553 |
| 6,958,652 | B2 | | 10/2005 | Kim | |
| 7,019,586 | B2 | * | 3/2006 | Dong | 327/553 |
| 7,135,915 | B2 | * | 11/2006 | Bailey et al. | 327/553 |
| 2005/0156661 | A1 | * | 7/2005 | Kimura | 327/552 |

FOREIGN PATENT DOCUMENTS

TW    541788    7/2003

* cited by examiner

Primary Examiner—Dinh T. Le
(74) Attorney, Agent, or Firm—Winston Hsu (57) ABSTRACT

Tuning circuits and related method for tuning transconductance in a transconductor-capacitor (Gm-C) filter system are provided. In the tuning circuit, a periodic input signal with constant amplitude triggers a transconductor cell to charge/discharge a capacitor for building an output signal across the capacitor, and a magnitude-detection feedback circuit provides feedback to tune a transconductance of the transconductor cell according to a magnitude of the output signal, such that the magnitude of the output signal can be locked within a predetermined magnitude range. When the magnitude of the output signal is locked, the ratio between transconductance and capacitance is also locked to a predetermined value because the magnitude of the output signal is determined by a ratio between transconductance and capacitance.

12 Claims, 7 Drawing Sheets

TUNING CIRCUIT FOR TRANSCONDUCTORS AND RELATED METHOD

BACKGROUND OF THE INVENTION

1. Field of the Invention

The invention relates to a transconductance tuning circuit and related method thereof, and more particularly, to a transconductance tuning circuit utilizing an amplitude lock loop to tune the transconductance and related method thereof.

2. Description of the Prior Art

In today's information society, documents, data, video, and audio information can be transferred through electronic signals. Therefore, the signal processing circuits associated with the transferring of the electronic signals have become the most importance hardware in the modern society.

The signal processing circuit often includes various kinds of filters. As is well known, one technique for implementing a filter is to utilize a transconductor cell (also known as a Gm cell) to build a transfer function of a filter. The above-mentioned transconductor cell is a circuit capable of transforming an input voltage into an output current according to a transconductance. That is, the transformation relationship (e.g., ratio) between the input voltage and the output current is determined by the transconductance of the transconductor cell. Furthermore, a transconductor cell can cooperate with a capacitor such that an integrator can be achieved. Furthermore, by combining a plurality of integrators, the filter can achieve different kinds of transfer functions. For example, by combining two transconductor cells and two capacitors, a first-order transfer function can be achieved. By combining four transconductor cells and four capacitors, a two-order transfer function can be achieved. Because the above-mentioned filter is composed of transconductor cells and capacitors, the filter can be called as transconductor-capacitor (Gm-C) filter. The Gm-C filter can perform a high-frequency and continuous-time filtering function. Therefore, the Gm-C filter becomes a new research point.

Obviously, the characteristic of the above-mentioned Gm-C filter is determined by the capacitance of each capacitor and the transconductance of each transconductor cell. For example, the bandwidth of the filter, the poles, and the zeros of the transfer function, the gain of the filter are all related to the transconductance and the capacitance. In addition, the ratio of the transconductance and the capacitance (Gm/C) is one of the most important parameters because the ratio often dominates the frequency response of the filter (e.g., it dominates the poles and zeros of the above-mentioned transfer function). However, due to the manufacturing variance and operational temperature variance, the transconductance and the capacitance may shift such that the ratio changes. This directly influences the characteristic of the filter.

To compensate for the non-ideal factors such as the above-mentioned manufacturing and temperature variances, tunable transconductor cells are utilized in a normal Gm-C filter. Furthermore, a transconductance tuning circuit is utilized to adjust the transconductance of each transconductor cell to compensate for the non-ideal factors. That is, because the transconductor cells inside the filter are tunable, the transconductance tuning circuit can properly adjust the transconductance such that the characteristic (e.g., the ratio Gm/C) of the filter can be adjusted to the original design characteristic. For example, if the capacitance of each capacitor inside the filter increases 5% due to the manufacturing process variances, the transconductance tuning circuit can adjusts the transconductance of each transconductor cell to make the transconductance increase 5%. Therefore, the ratio Gm/C is compensated to achieve the original value such that the characteristic integrity of the filter can be maintained.

But, the prior art transconductance tuning circuit and technique often occupies a significant layout area and consumes significant power because the transconductance tuning circuit is often very complex. This makes the entire Gm-C filter, including the transconductance tuning circuit, require a larger layout area, cost more to manufacture, and consume more power. Obviously, these problems concerning the Gm-C filter require solutions.

SUMMARY OF THE INVENTION

It is therefore the claimed invention providing a better transconductance tuning circuit and related method thereof to achieve the transconductance tuning function utilizing a smaller layout area and consuming less power, to solve the above-mentioned problem. Furthermore, the claimed invention utilizes the Gm-C filtering technique more easily and more accurately.

According to an exemplary embodiment of the claimed invention, a transconductance tuning circuit is disclosed. The transconductance tuning circuit includes a transconductor cell, a capacitor module, and an amplitude detecting feedback circuit. The transconductor cell is capable of receiving an input signal and providing a corresponding driving signal to make a value of the driving signal correspond to a level of the input signal and a transconductance. The transconductor cell is capable of tuning the transconductance according to a control signal. The capacitor module receives the driving signal to control its charging or discharging operations to provide a corresponding output signal. The amplitude detecting feedback circuit is capable of tuning a value of the control signal according to a level of the output signal and utilizing the feedback control signal to lock amplitude of the output signal in a predetermined range.

According to another exemplary embodiment of the claimed invention, a transconductance tuning method is disclosed. The transconductance tuning method includes the following steps. First, providing an input signal and generating a corresponding driving signal according to a transconductance to make a value of the driving signal correspond to a level of the input signal and the transconductance. Then, utilizing the driving signal to charge or discharge a capacitor module and providing a corresponding output signal according to the charging or discharging operations. And tuning the transconductance according to the level of the output signal.

Because the present invention transconductance circuit requires only a single transconductance cell, the present invention can occupies less layout area and can consumes less power. Therefore, the present invention uses a simple circuit to maintain the characteristic of the Gm-C filter such that the Gm-C filter can function accurately.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
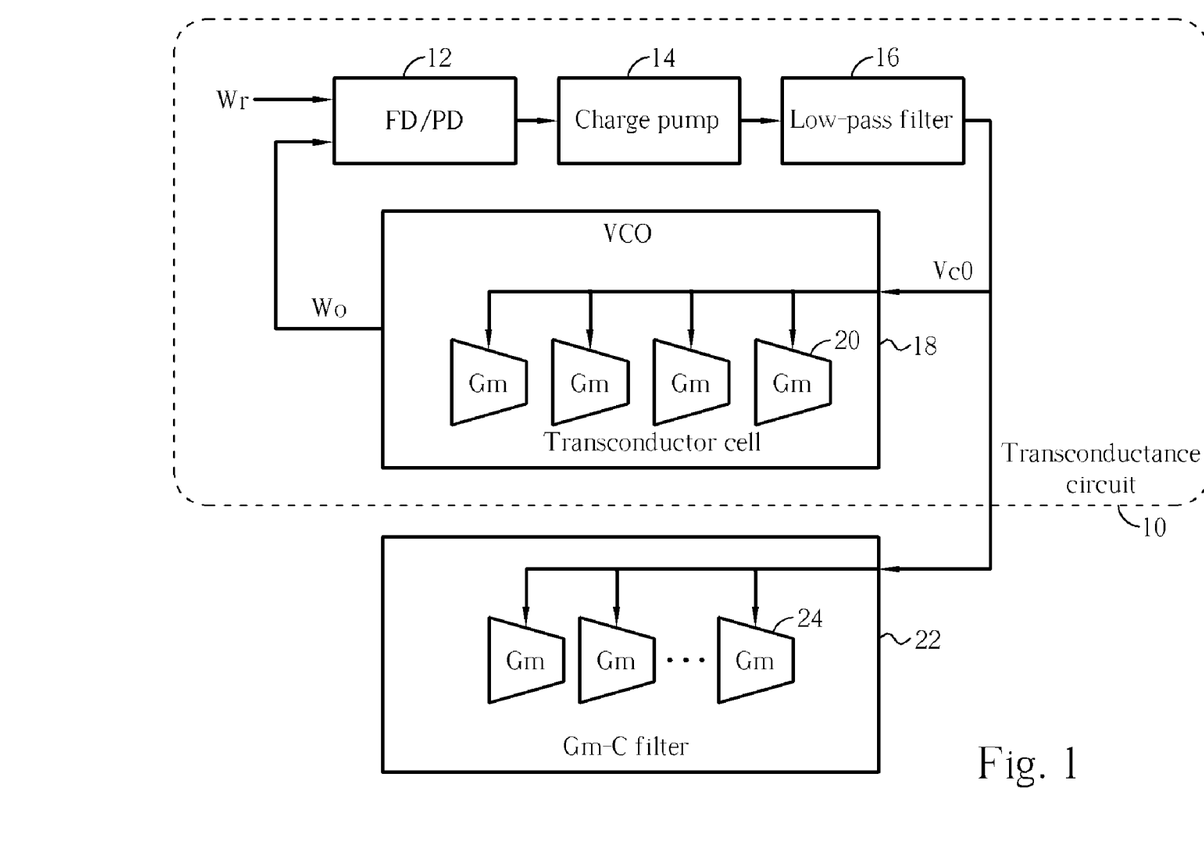
FIG. 1 is a circuit diagram of a filter system having a conventional transconductance tuning circuit and a Gm-C filter.

Please refer to FIG. 1, which is a circuit diagram of a filter system having a conventional transconductance tuning circuit 10 and a Gm-C filter 22. The Gm-C filter 22 includes a plurality of transconductor cells 24 to achieve a specific transfer function of the filter. Please note that as mentioned previously, these transconductor cells cooperate with a plurality capacitors, and these capacitors are not shown in FIG. 1. The transconductance tuning circuit 10 tunes the transconductance of each transconductor cell 24 by utilizing a PLL mechanism to make the characteristic of the Gm-C filter 22 capable of compensating for thereby overcoming the manufacturing process variances and temperature variances.

As shown in FIG. 1, the transconductance tuning circuit 10 includes a detector 12, a charge pump 14, a low-pass filter 16, and a voltage-controlled oscillator (VCO) 18 such that a phase lock loop (PLL) is formed. Wherein the detector 12 can be implemented by a frequency detector (FD), a phase detector (PD), or a phase-frequency detector (PFD). The VCO 18 can generate a clock Wo. The detector 12 can compare the clock Wo with another reference clock Wr, which has a fixed frequency, to detect the frequency or phase difference between the clock Wo and the reference clock Wr. The detection result of the detector 12 is then processed by the charge pump 14 and the low-pass filter 16 to form a control signal Vc0. The control signal Vc0 is feedback to the VCO 18 such that the VCO 18 can properly adjust the frequency of the clock Wo according to the control signal Vc0. The purpose of the PLL is to lock the frequency of the clock Wo to that of the frequency of the reference clock Wr.

To compensate for the changes of the transconductance and capacitance of the Gm-C filter 22, the VCO 18 is also composed of a plurality of transconductor cells 20 (and a plurality of capacitors). As mentioned previously, the transconductor cells and the capacitors can achieve a multitude of transfer functions. Therefore, they can achieve the oscillation function of the VCO 18. The characteristics of the VCO 18, for example, the oscillation frequency of the VCO 18, are controlled by the ratio Gm/C of each transconductor cell 20 and a corresponding capacitor. The control signal Vc0 is utilized to tune the transconductance of each transconductor cell 20 such that the frequency of the output signal of the VCO 18 (that is, the frequency of the clock Wo) is controlled by the control signal Vc0. Since the frequency of the clock Wo is determined by the ratio Gm/C, when the PLL stably locks the clock Wo and the reference clock Wr to make the frequency of the clock Wo equal to that of the reference clock Wr, the ratio Gm/C should be locked to a predetermined value. This means that the ratio Gm/C is tuned. Furthermore, the control signal Vc0 can be utilized to tune the transconductance of the Gm-C filter 22 such that the Gm-C filter 22 is capable of compensating for and thereby overcoming the manufacturing process variances and temperature variances.

For example, assume that the capacitance of the capacitors of the filter system shown in FIG. 1 becomes greater than the designed capacitance due to the imperfections of the manufacturing process. When the PLL first starts, the transconductance of each transconductor cell 20 corresponds to the original designed transconductance. At this time, the frequency of the clock Wo is less than that of the reference clock Wr. After the PLL performs the phase-locking operations stably, the frequency of the clock Wo is locked to the frequency of the reference clock Wr. This also indicates that the transconductance of each transconductor 20 has increased properly to compensate for the increased capacitance. Obviously, if the transconductance of the Gm-C filter 22 can be properly tuned according to the changed capacitance, the characteristic of the Gm-C filter 22 can be close to the original designed characteristic.

But, the transconductance tuning circuit 10 shown in FIG. 1 has its disadvantages. When the transconductor cells are utilized to achieve a transfer function of the oscillation function, a second order transfer function should be achieved. Therefore, in the VCO 18, four transconductor cells (and corresponding capacitors) must be used. As a result, the layout area and power consumption of the transconductance tuning circuit 10 are increased. Moreover, to prevent the reference clock Wr from influencing the operations of the Gm-C filter 22, the frequency of the reference clock Wr must be greater than the working frequency range of the Gm-C filter 22. This ensures that the entire transconductance tuning circuit 10 operates in a high frequency because of the high-frequency reference clock Wr, and further increases the power consumption of the transconductance tuning circuit 10. Furthermore, the VCO 18 is utilized to generate oscillations in circuits, and oscillations represent an unstable state. Therefore, when implementing the transconductance tuning circuit 10, many details must be considered. For example, the exact time for starting the VCO 18 to oscillate. These increase the complexity of the transconductance tuning circuit 10 and the time and cost of designing and producing the transconductance tuning circuit 10.

To overcome the disadvantages of the conventional transconductance tuning circuit, the present invention discloses a transconductance tuning circuit and related method thereof, which are based on an amplitude lock loop. Please refer to FIG. 2, which is a block diagram of a transconductance tuning circuit 30 installed inside a filter system 40 according to the present invention. The filter system 40 includes only one Gm-C filter or more Gm-C filters. Please note that in FIG. 2, the Gm-C filter 38 is shown. Each Gm-C filter includes one or more transconductor cells 42 (and corresponding capacitors which are not shown in FIG. 2). The transconductance tuning circuit 30 tunes the transconductance of each Gm-C filter of the filter system 40 such that the Gm-C filter is capable of compensating for and thereby overcoming the environment variances due to multiple non-ideal factors.

To achieve the transconductance tuning technique of the present invention, the transconductance tuning circuit 30 includes a transconductor cell 32, a capacitor module 34, and an amplitude detecting feedback circuit. The transconductor cell 32 has a tunable transconductance, and receives an input signal Vi and transconducts the input signal Vi to generate a corresponding output current Io as a driving signal. As is well known, the ratio of the driving signal Io and the input signal Vi corresponds to the transconductance Gm of the transconductor cell 32. The transconductance Gm of the transconductor cell 32 is controlled by a control signal Vc. The capacitor module 34 includes at least one capacitor (in FIG. 2, the capacitor C is shown as an example) for establishing a voltage Vo across the capacitor C as an output signal Vo by performing a charging and discharging operation according to the current Io. The amplitude detecting feedback circuit 36 tunes the control signal Vc according to the output signal Vo for utilizing the feedback mechanism to fix the level of the output signal within a predetermined amplitude range. For example, when the level of the output signal Vo is greater than a predetermined target range, the amplitude detecting feedback circuit 36 tunes the value of the control signal Vc as a feedback such that the transconductor cell 32 tunes the transconductance Gm and the output current Io is therefore reduced. On the other hand, when the level of the output signal Vo is within the predetermined target range, the amplitude detecting feedback circuit 36 tunes the value of the control signal Vc as a feedback such that the transconductor cell 32 tunes the transconductance Gm and the output current is therefore increased.

To reflect the capacitance change and the transconductance change of the transconductor cell 42 inside the Gm-C filter 38, the electronic characteristic of the transconductance cell 32 and each transconductor cell 42 of the Gm-C filter 38 are similar. For example, each transconductor cell 32 and 42 can be implemented in a same chip through the same layout and manufacturing process. Therefore, the transconductor cell 32 can represent the characteristic of each transconductor cell 42. Similarly, the characteristics of the capacitor of the capacitor module 34 are similar to each capacitor of the Gm-C filter 38. For example, the capacitor of the capacitor module 34 and the capacitor of the Gm-C filter 38 can be implemented in a same chip through the same layout and manufacturing process. As a result, these capacitors react identically to the environment.

Figure 2:
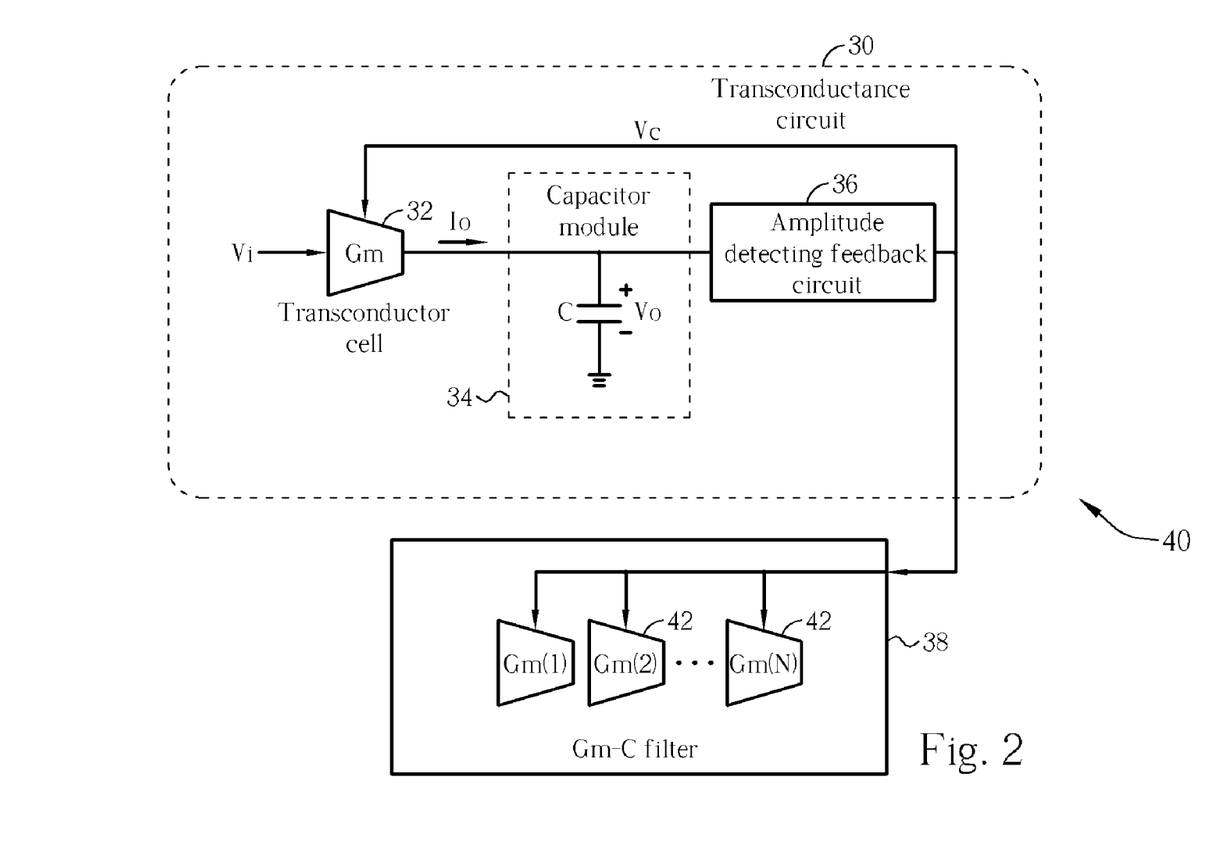
FIG. 2 is a block diagram of a transconductance tuning circuit installed inside a filter system according to the present invention.
Figure 3:
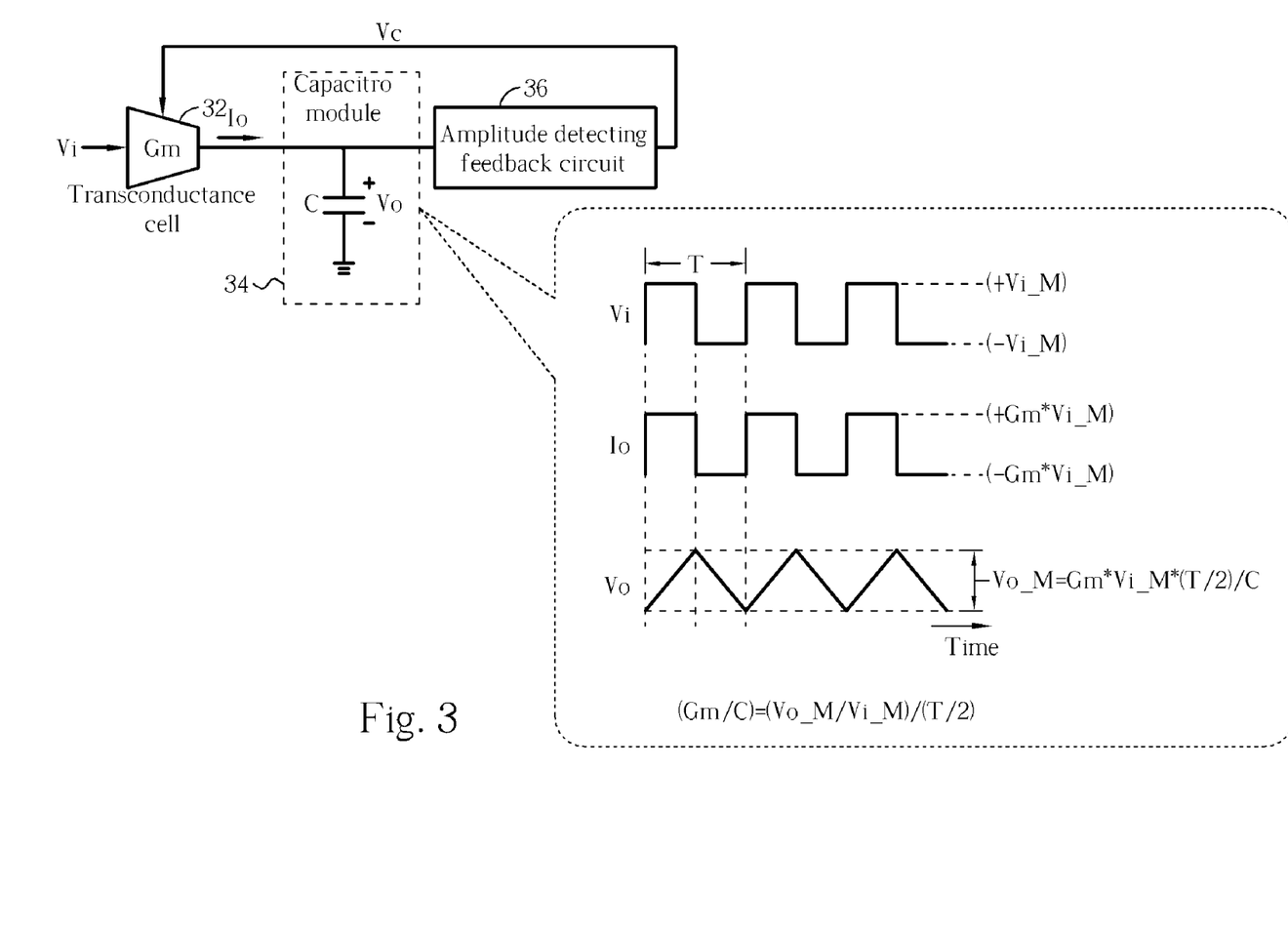
FIG. 3 illustrates the operation of the transconductance tuning circuit in FIG. 2.

To further illustrate the operation of the transconductance tuning circuit 30 of the present invention, please refer to FIG. 3 in conjunction with FIG. 2. FIG. 3 illustrates the operation of the transconductance tuning circuit 30. When the transconductance tuning circuit 30 operates, the transconductance cell 32 is triggered by the input signal Vi to generate an output current Io. In the present invention, the input signal Vi can be a square wave voltage signal having a constant frequency. As shown in FIG. 3, the voltage amplitude of the input signal Vi can be Vi_M, and the period of the input signal Vi is the constant T. This makes the input signal Vi vary within the range of +Vi_M~−Vi_M in a square waveform. The transconductor cell 32 outputs the current Io according to the equation Io(t)=Gm*Vi(t) after being triggered by the input signal Vi. Obviously, the current Io varies in the range +Gm*Vi_M~−Gm*Vi_M in a square waveform as shown in FIG. 3.

When the current Io is inputted to the capacitor module 34, the capacitor C performs the charging and discharging operations through the current Io such that a saw tooth waveform voltage (the output signal Vo) is established across the capacitor C. As shown in FIG. 3, when the current Io is maintained as the value Gm*Vi_M in the first half period, the capacitor C is charged such that the voltage level of the output signal Vo increases linearly. According to the charging theory of the capacitor, the increased value Vo_M of the output signal Vo is equal to Gm*Vi_M*(T/2)/C. Similarly, in the last half period, when the current Io is changed to be −Gm*Vi_M, the capacitor C is discharged through the current Io such that the voltage level of the output signal Vo decreases linearly. The decreased value of the output signal Vo is also equal to Gm*Vi_M*(T/2)/C.

Considering the above discussion, when the period T and the amplitude Vi_M of the input signal are fixed, the voltage amplitude Vo_M of the output signal Vo is determined by the ratio (Gm/C) of the transconductance and the capacitance. That is, when the ratio (Gm/C) varies due to the non-ideal factors, the voltage amplitude Vo_M of the output signal Vo varies accordingly. Therefore, if the voltage amplitude Vo_M can be locked in a certain value by an amplitude lock loop, the ratio Gm/C is also correspondingly locked in a predetermined value. This provides the basic theory of the present invention.

In other words, the amplitude detecting feedback circuit 36 utilizes the control signal Vc to repeatedly tune the transconductance Gm of the transconductance cell 32 such that the voltage variance range of the output signal Vo is also locked in a predetermined amplitude range (that is, the voltage amplitude Vo_M is locked in a predetermined value). After the locking operation is completely performed, the ratio Gm/C is naturally close to a predetermined designed value and is capable of compensating for and thereby overcoming the non-ideal factors. Furthermore, the control signal Vc, which is utilized to tune the transconductance Gm of the transconductor cell 32, can also be utilized to tune the transconductance of other transconductor cells 42 (as shown in FIG. 2) of the Gm-C filter 38 such that the transconductance tuning purpose can be achieved. Equivalently, while the ratio of voltage amplitudes (Vo_M/Vi_M) remains locked to a certain value, the ratio Gm/C has been locked to a predetermined design value.

For example, assume that the capacitance of each capacitor inside the filter system 40 shown in FIG. 2 is greater than the original expected capacitance due to the variations of the manufacturing process. When the amplitude lock loop starts to operate, each transconductance of each transconductor cell 42 corresponds to its original designed value. This means that the ratio Gm/C shifts and the amplitude of the output signal Vo is reduced because the capacitance is changed when the amplitude lock loop begins operation. But the amplitude lock loop starts to repeatedly tune the transconductance Gm to cause the amplitude of the output signal Vo start to move to a predetermined amplitude range. After the amplitude locking operation is completely performed, the transconductance Gm should have increased to compensate for the increased capacitance and further to maintain the ratio Gm/C at its original design value. Therefore, because of the amplitude lock loop, the filter system 40 is capable of compensating for and thereby overcoming the non-ideal factors.

Figure 4:
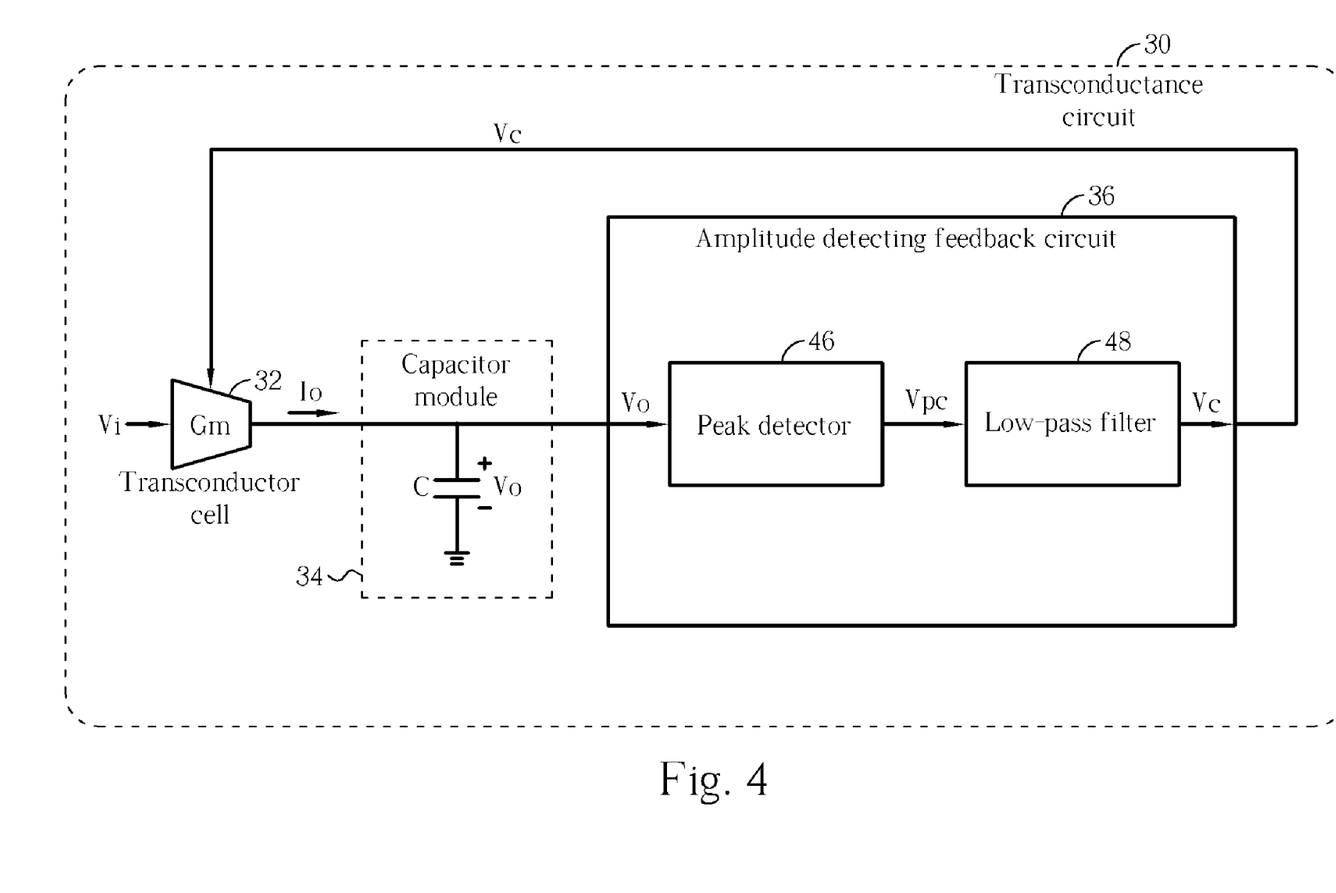
FIG. 4 illustrates an amplitude detecting feedback circuit of another embodiment according to the present invention.

Please refer to FIG. 4, which illustrates an amplitude detecting feedback circuit 36 of another embodiment according to the present invention. As shown in FIG. 4, in this embodiment, the amplitude detecting feedback circuit 36 includes a peak detector 46 and a low pass filter 48. The peak detector 46 is utilized to detect the voltage amplitude of the output signal Vo and to provide a corresponding pre-control signal Vpc according to the detecting result. The low-pass filter 48 provides a control signal Vc according to the pre-control signal Vpc. For example, performing a low-pass filtering operation on the pre-control signal Vpc to generate a control signal Vc. Additionally, the low-pass filter 48 feedbacks the control signal Vc to the transconductor cell 32 such that the amplitude lock loop is formed.

Figure 5:
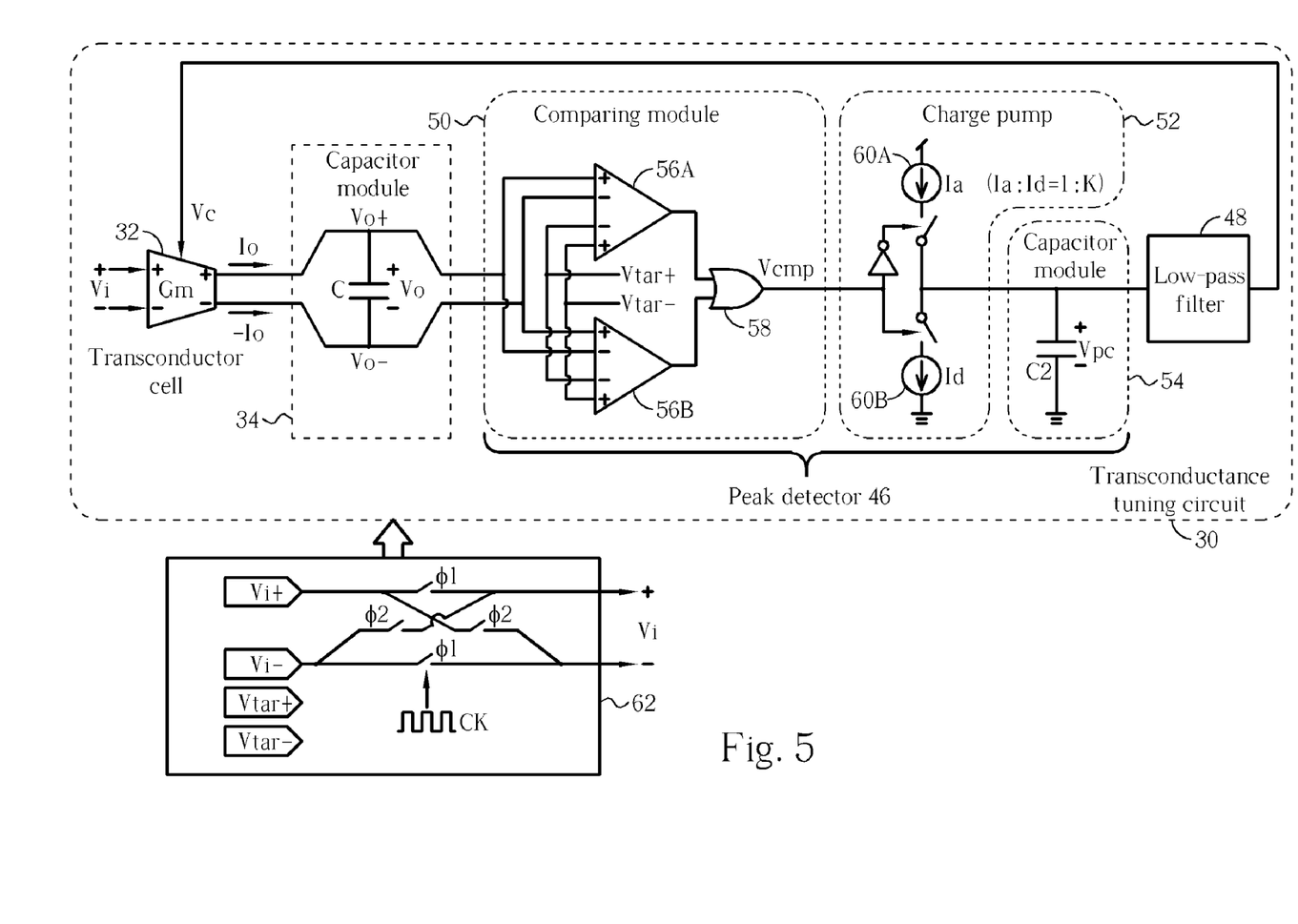
FIG. 5 illustrates an embodiment of a transconductance tuning circuit shown in FIG. 4.

Please refer to FIG. 5, which illustrates an embodiment of a transconductance tuning circuit 30 shown in FIG. 4. As shown in FIG. 5, in an embodiment, the peak detector 46 includes a comparing module 50, a charge pump 52, and another capacitor module 54. Furthermore, the transconductance tuning circuit 30 cooperates with another reference circuit 62 during operation.

In general, differential circuits are capable of compensating for and thereby overcoming the noises better than the single-mode circuits. Therefore, in the embodiment shown in FIG. 5, the differential-type transconductor cell 32 is utilized as an embodiment. The differential transconductor cell 32 includes two input ends, where the input ends respectively output two inverting output currents Io and −Io to charge or discharge the capacitor C of the capacitor module 34 such that the output signal Vo can be established. The comparing module 50 detects whether the voltage level of the output signal Vo exceeds a predetermined target range and output the detection result as the signal Vcmp. The charge pump 52 charges or discharges the capacitor C2 of the capacitor module 54 according to the signal Vcmp of the comparing module 50. Therefore, a voltage can be established across the capacitor C2 of the capacitor module 54 as the above-mentioned pre-control signal Vpc.

In general, in the tunable transconductor cell 32 and other transconductor cells, the level (e.g., the voltage level) of the control signal Vc is proportional to the transconductance Gm. This means that the transconductance Gm increases and decreases with respect to the control signal Vc. That is, as the voltage level of the control signal Vc increases so to does the transconductance Gm. Given this condition, the operation of the peak detector 46 can be illustrated as follows. When the level of the output signal Vo exceeds the predetermined target range, the comparing module 50 can make the charge pump 52 discharge the capacitor C2 of the capacitor module 54 such that the voltage level of the pre-control signal Vpc decreases. Therefore, the control signal Vc correspondingly decreases. In the opposite fashion, when the voltage level of the output signal Vo is within the target range, the comparing module 50 can make the charge pump 52 charge the capacitor module 54 such that the voltage level of the pre-control Vpc increases. Therefore, the control signal Vc correspondingly increases. Essentially, when the level of the output signal Vo exceeds the target range, it is likely that the transconductance Gm is too large. Therefore, the comparing module 50 reduces the control signal Vc through the charge pump 52 and the capacitor module 54. And then, the control signal Vc is feedback such that the transconductance Gm is reduced. Oppositely, when the level of the output signal Vo is within the predetermined target range, the transconductance Gm may be insufficient. Therefore, the comparing module 50 increases the level of the control signal Vc through the charge pump 52 and the capacitor module 54. Similarly, the control signal Vc is feedback to increase the transconductance Gm.

In order to achieve the above-mentioned function, two comparators 56A and 56B can be installed inside the comparing module 50 to cooperate with the differential transconductor cell 32. The comparators 56A and 56B can also be differential-type circuits. Please note, the comparator 56A detects whether the output signal Vo is larger than a predetermined voltage Vtar (please note, the voltage Vtar is equal to (Vtar+)−(Vtar−), and the voltage Vtar+ and the voltage Vtar− are constant DC voltages). The comparator 56B compares whether the output signal Vo is less than the negative voltage Vtar−. Therefore, the voltages Vtar+ and Vtar− are defined as the predetermined target range of the comparing module 50. The comparison result of the two comparators 56A and 56B is processed by the AND logic gate 58 such that a signal Vcmp is generated. The charge pump 52 includes two current sources 60A and 60B, which are controlled by the signal Vcmp to charge or discharge the capacitor C2. When the signal Vcmp corresponds to a high level (that is, when the output signal Vo is greater than the voltage Vtar+ or less than the voltage Vtar− such that the output signal Vo is over the predetermined target range), the current source 60B outputs a current Id (the current Id can be a constant current) to discharge the capacitor C2. Oppositely, when the signal Vcmp corresponds to a low level, the current source 60A outputs a current Ia (the current Ia can also be a constant current) to charge the capacitor C2. Please note, the current Ia and the current Id have a fixed proportional relationship. That is, Ia/Id=1/K, where K is a constant.

The reference source circuit 62 shown in FIG. 5 is utilized to provide each constant DC voltage to the transconductance tuning circuit 30. As mentioned previously, the constant DC voltages Vtar+ and Vtar− are utilized to define the above-mentioned target range of the comparing module 50. The constant DC voltages Vi+ and Vi− can be used to generate a periodic input signal Vi having a constant amplitude through switching the DC voltages Vi+ and Vi− according to a clock CK having a fixed frequency. As shown in FIG. 5, when the clock CK corresponds to a phase of a certain level (for example, a high level), the level of the input signal Vi corresponds to the voltage (Vi+)−(Vi−). On the other hand, when the clock CK corresponds to a phase of another level (for example, a low level), the level of the input signal Vi is equal to the (Vi−)−(Vi+). Furthermore, if a common-mode voltage is needed for controlling the differential transconductor cell 32 (and other differential circuit units), the reference source circuit 62 can be utilized to provide a constant DC common mode voltage.

Figure 6:
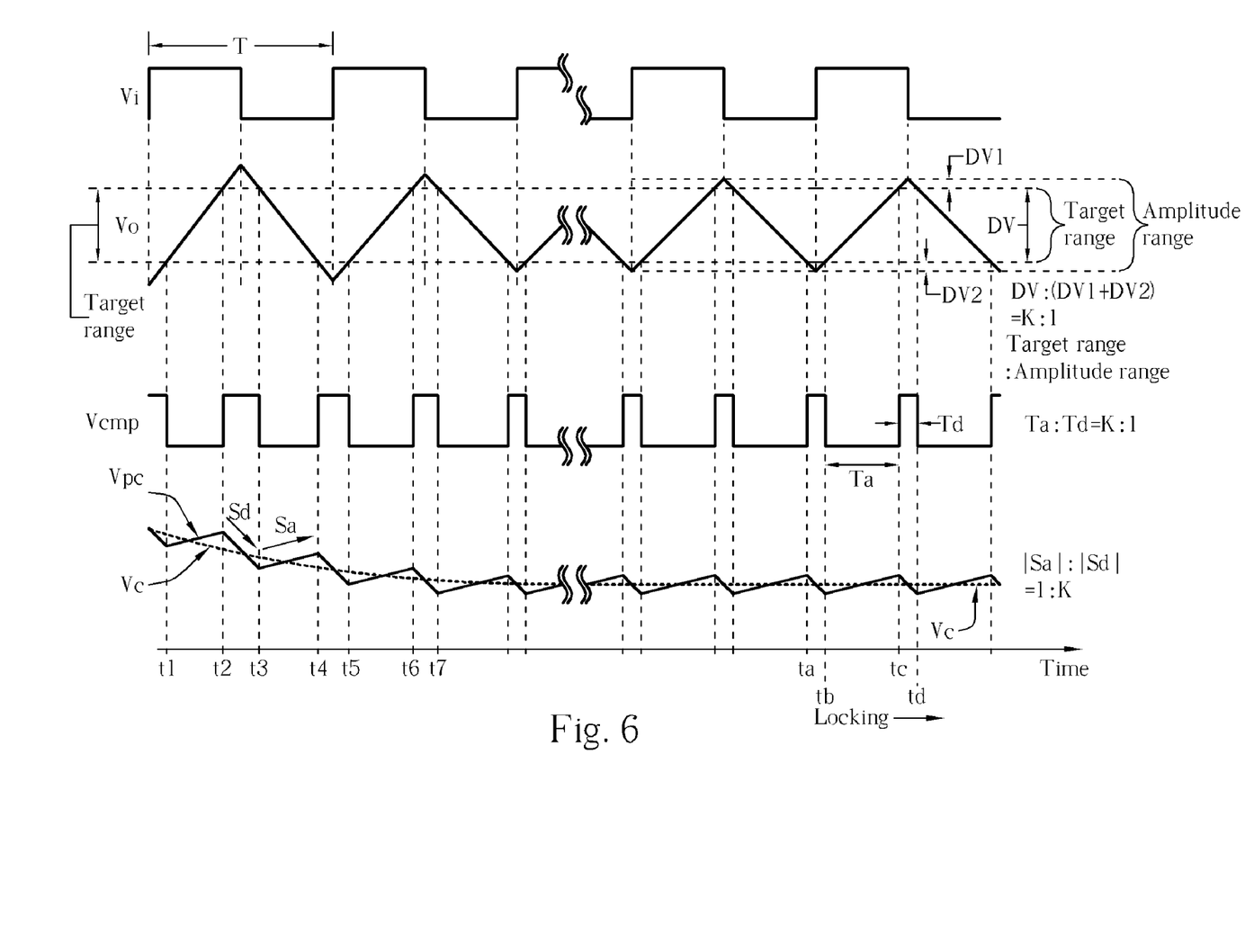
FIG. 6 is a diagram of waveforms of each signal of the transconductance tuning circuit shown in FIG. 5.

To further illustrate the operations of each circuit shown in FIG. 5, please refer to FIG. 6 in conjunction with FIG. 5. FIG. 6 is a diagram of waveforms of each signal of the transconductance tuning circuit 30 shown in FIG. 5. The horizontal axis shown in FIG. 6 represents time, and the vertical axis shown in FIG. 6 represents the voltage level. As shown in FIG. 6, the voltage level of the output signal Vo changes in a saw tooth waveform because the input signal Vi is periodically triggered. Furthermore, the comparing module 50 shown in FIG. 5 detects whether the level of the output signal Vo is over a predetermined target range (in this embodiment, the target range is defined by the fixed voltages Vtar+ and Vtar−), and provides a corresponding signal Vcmp to reflect the comparison result. For example, between the time t1 and t2, the voltage level of the output signal Vo is within the predetermined target range, therefore, the signal Vcmp corresponds to a low level. At this time, the current source 60A (shown in FIG. 5) charges the capacitor C2 such that the voltage level of the pre-control signal Vpc increases linearly, where the increasing slope is Sa. Between the time t2 and t3, the level of the output signal Vo is over the predetermined target range, therefore, the signal Vcmp corresponds to a high level such that the current source 60B discharges the capacitor C2 to make the pre-control signal Vpc decrease linearly, where the decreasing slope is Sd. As mentioned previously, the ratio of the currents Ia/Id=1/K. Therefore, the relationship between the two slopes is: |Sa|/|Sd|=1/K.

From FIG. 3 and the related discussion, it can be seen that the output signal Vo changes according to the ratio Gm/C. Therefore, when the ratio Gm/C is larger than a predetermined designed value, the output signal Vo having a saw tooth waveform increases or decreases quickly. In this case, the voltage level of the output signal Vo is enormously over the predetermined target range. And the time interval when the voltage level is over the target range becomes longer. The discharging time that the current source 60B discharges the capacitor C2 is also longer. This makes the voltage level of the pre-control signal Vpc lower. For example, in FIG. 6, the output signal Vo increases quickly at time t1. Between time t2 and t3, the peak is enormous over the target range. The time interval when the peak is over the target range (the time interval between time t2 and t3) is longer. Therefore, the current source 60B has more time to discharge the capacitor C2. This makes the entire pre-control Vpc lower. Furthermore, the control signal Vc shown as the dotted line in FIG. 6 also decreases such that the control signal Vc is feedback to the transconductor cell 32 to tune the transconductance Gm to be less. Therefore, the changing trend, either an increasing trend or a decreasing trend, of the output signal Vo is getting slow. Oppositely, if the ratio Gm/C is smaller, the changing rate of the output signal Vo is slower. Therefore, the time interval that the output signal Vo is within the target range increases. The current source 60A has more time to charge the capacitor C2. Therefore, the entire pre-control signal Vpc is higher such that the control signal Vc increases. When the control signal Vc is feedback to the transconductor cell 32, the transconductance Gm of the transconductor cell 32 increases.

After the lock loop completely performs the locking operation (for example, after the time ta), the time that the output signal Vo is over the target range (such as the time interval Td) and the time that the output signal Vo is in the target range (such as the time interval Ta) should have the relationship Ta:Td=K:1. As mentioned previously, the relationship between the charging or discharging currents of the charge pump can be shown as Ia/Id=1/K. Therefore, the pre-control signal Vpc can be stable (that is, the pre-control signal Vpc can be a constant value). Furthermore, the control signal Vc can be a constant value because of the constant pre-control signal Vpc. This makes the transconductance Gm fixed. The fixed transconductance Gm can make the ratio Gm/C become its originally designed value.

In other words, we can define the condition of finishing the amplitude locking operation (that is, at the time when Ta/Td=K/1) and the amplitude of the output signal Vo (as shown in FIG. 6, when the amplitude is locked, the ratio of the overshoot DV1+DV2 where the output signal Vo is over the target range DV and the target range DV is 1/K. Therefore, the amplitude range of the output signal Vo can be known after the amplitude is locked) by setting the constant K of the above-mentioned ratio 1/K of the current sources 60A and 60B. This also means that the ratio Gm/C is also defined because of the setting of the constant K. In other words, the designer determines the constant K according to the expected ratio Gm/C, and achieve the determined constant K in the charge pump. And then, the amplitude lock loop locks the ratio Gm/C to the expected value through locking the amplitude.

Please refer to FIG. 5 again. In the reference source circuit 62, each DC voltages Vi+, Vi−, Vtar+, and Vtar− can be generated through a same resistor-based voltage divider. Although the DC voltages may shift because the resistance of the resistor in the resistor-based voltage divider changes due to the manufacturing process variances and temperature variances. But the ratio of DC voltages is still the same. As shown in FIG. 3 and the related equation, while the amplitude ratio Vo_M/Vi_M is fixed as a designed value, the ratio Gm/C can be locked to a designed value. Please note, the amplitude Vo_M is determined by the voltages Vtar+ and Vtar−, and the voltage Vi_M is determined by the voltages Vi+ and Vi−. Therefore, while the ratio of each voltage is still the same, the present invention can still utilize the amplitude lock loop to lock the ratio Gm/C to a predetermined designed value even if the values of the voltages Vi+, Vi−, Vtar+, and Vtar− may shift.

Please note, FIG. 5 and FIG. 6 are only utilized to illustrated embodiments of the present invention. One of the objectives of the present invention is to use the amplitude lock loop to tune the transconductance. Therefore, all other equivalent circuits capable of tuning the transconductance obey the spirit of the present invention. For example, in the embodiment shown in FIG. 5, the capacitor module 34 can include two capacitors, which match each other. Each capacitor is respectively coupled between a current output end of the transconductor cell 32 and ground. And the voltages across the two capacitors are utilized to be the output signal Vo.

Figure 7:
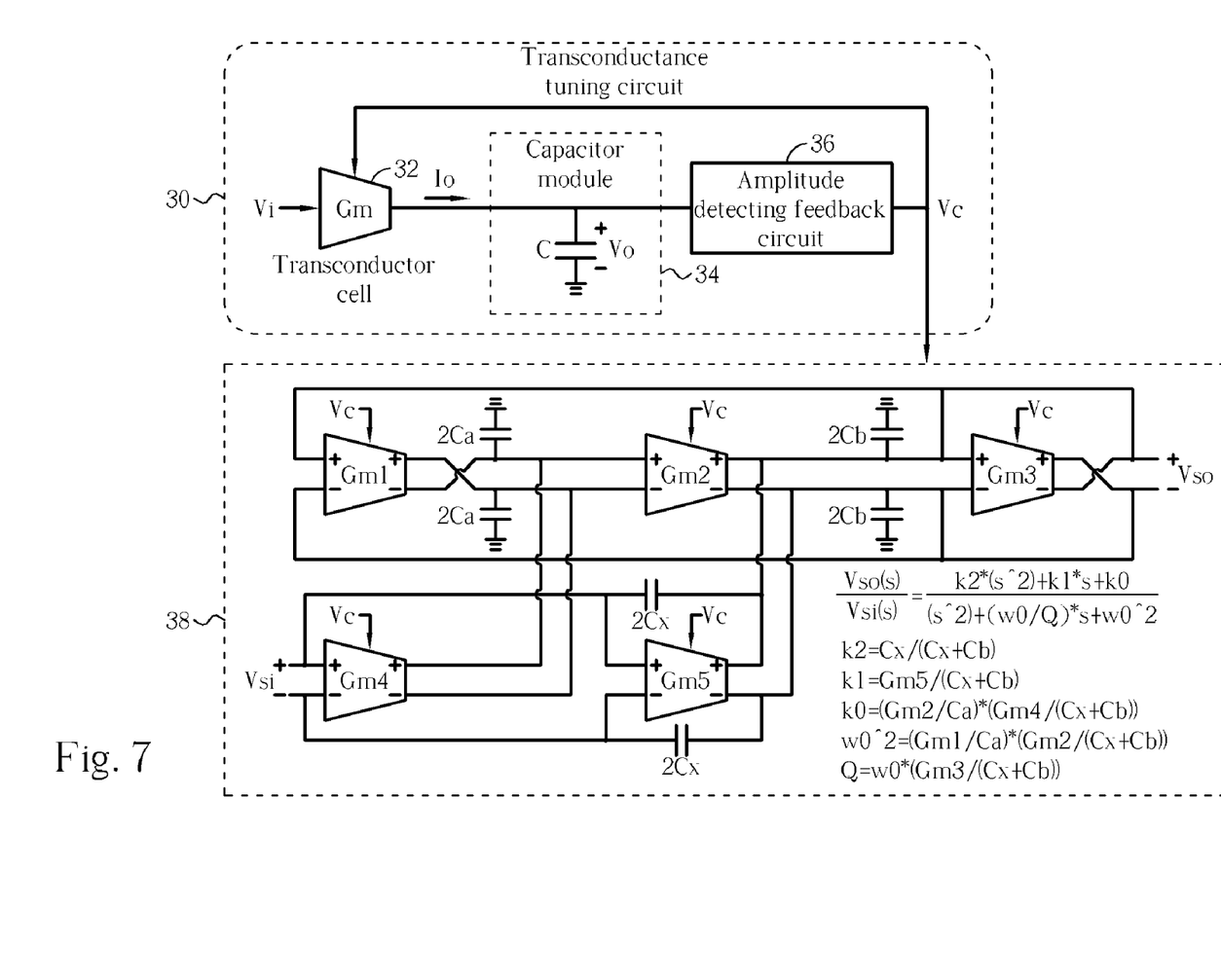
FIG. 7 utilizes a second-order Gm-C filter to illustrate the application of the transconductance tuning circuit according to the present invention.

Please refer to FIG. 7 which utilizes a second-order Gm-C filter to illustrate the application of the transconductance tuning circuit 30 according to the present invention. As shown in FIG. 7, the Gm-C filter 38 includes five transconductor cells (the transconductance of the five transconductor cells are respectively Gm1~Gm5) and capacitors Ca, Cb, and Cx. Please note, the Gm-C filter 38 can achieve a second order transfer function between the input signal Vsi and the output signal Vso. From each equation shown in FIG. 7, the coefficients (such as k0, k1) of the transfer function, and the characteristic parameters (such as the resonant corner frequency w0, and the quality factor Q) of the filter are all related to the ratio Gm/C. The present invention tuning circuit 30 can utilize the amplitude lock loop to lock the ratio Gm/C to a predetermined the designed value to ensure that the Gm-C filter 38 works accurately.

In contrast to the prior art, the present invention can utilize a single transconductor cell and a corresponding capacitor to achieve the transconductance tuning function of a Gm-C filter according to the theory of the amplitude lock loop. Therefore, the present invention transconductance tuning circuit occupies a smaller layout area, consume less power, reduces the time and cost of producing the circuits, and makes the Gm-C filtering technique more easily achieved and accurate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transconductance tuning circuit comprising:
   a transconductor cell, capable of receiving an input signal and providing a corresponding driving signal, the transconductor cell having a transconductance being changeable according to a control signal, the input signal being a square wave voltage signal having a constant frequency;
   a capacitor module having an input being coupled to the capacitor module for charging or discharging according to the driving signal to thereby provide a corresponding output signal; and
   an amplitude detecting feedback circuit having an input being coupled to the output signal of the capacitor module, the amplitude detecting feedback circuit for tuning a value of the control signal according to an amplitude level of the output signal and utilizing feedback of the control signal to the transconductor cell to lock an amplitude of the output signal within a predetermined range;
   wherein the amplitude detecting feedback circuit includes:
      a peak detector, for detecting the amplitude of the output signal and providing a corresponding pre-control signal being asserted when the amplitude of the output signal exceeds a predetermined value, the peak detector comprising:
         a comparison module, for detecting whether the level of the output signal is greater than a predetermined target range; and
         a charge pump and at least a second capacitor module, the charge pump being capable of charging or discharging the second capacitor module according to a detection result of the comparison module such that the second capacitor module is capable of providing the pre-control signal according to the detection result; and a low-pass filter being coupled directly to the pre-control signal being outputted from the peak detector, the low pass-pass filter for providing the control signal according to the pre-control signal, and providing the control signal as feedback to the transconductor cell.

2. The transconductance tuning circuit of claim 1, wherein the transconductance of the transconductor cell correlates positively to the control signal to thereby allow the transconductance to simultaneously go up or down when the control signal goes up or down, respectively.

3. The transconductance tuning circuit of claim 1, wherein when the level of the output signal is greater than the predetermined range, the amplitude detecting feedback circuit tunes the control signal and provides the tuned control signal as feedback such that the transconductor cell reduces the value of the driving signal; and when the level of the output signal is within the predetermined range, the amplitude detecting feedback circuit tunes the value of the control signal and provides the tuned control signal as feedback to increase the value of the driving signal.

4. The transconductance tuning circuit of claim 1, wherein when the level of the output signal is greater than the predetermined range, the charge pump is for discharging the second capacitor module to reduce a level of the pre-control signal such that the value of the control signal is reduced; and when the level of the output signal is within the predetermined range, the charge pump is for charging the second capacitor module to increase the level of the pre-control signal such that the value of the control signal is increased.

5. The transconductance tuning circuit of claim 1, wherein the transconductor cell is for generating a current value of the driving signal corresponding to a product of the transconductance and the level of the input signal.

6. The transconductance tuning circuit of claim 1, wherein the input signal is a periodic signal having a constant amplitude.

7. The transconductance tuning circuit of claim 1, being utilized in a filter system, the filter system comprising at least a filter, each filter comprising at least one corresponding transconductor cell, and the control signal for tuning the transconductance of the transconductor unit of each filter.

8. A transconductance tuning method comprising:
(a) providing an input signal that is a square wave voltage signal having a constant frequency and generating a corresponding driving signal according to a transconductance to thereby generate a value of the driving signal corresponding to a level of the input signal and the transconductance;
(b) utilizing the driving signal to charge or discharge a capacitor module and providing a corresponding output signal according to the charging or discharging operations;
utilizing a comparison module for detecting whether a level of the output signal is greater than a predetermined target range;
utilizing a charge pump and at least a second capacitor module, the charge pump charging or discharging the second capacitor module according to a detection result of the comparison module such that the second capacitor module provides a pre-control signal according to the detection result;
utilizing a low-pass filter coupled directly to the pre-control signal to output a control signal according to the pre-control signal; and
(c) tuning the transconductance according to a level of the control signal.

9. The transconductance tuning method of claim 8 further comprising:
repeatedly performing the steps (a), (b), and (c) to maintain an amplitude of the output signal within a predetermined amplitude range.

10. The transconductance tuning method of claim 8, wherein the step of tuning the transconductance according to the level of the control signal comprises:
reducing the transconductance if the level of the output signal is greater than a predetermined target range; otherwise, increasing the transconductance.

11. The transconductance tuning method of claim 8, wherein the value of the driving signal goes up or down simultaneously when the transconductance goes up or down.

12. The transconductance tuning method of claim 8, being utilized in a filter system, the filter system comprising at least one filter, each filter further performing its filtering function according to the transconductance, and the method further comprising:
simultaneously tuning a transconductance of a transconductor cell of each filter when the transconductance is being tuned.

* * * * *

UNITED STATES PATENT AND TRADEMARK OFFICE
CERTIFICATE OF CORRECTION

PATENT NO. : 7,468,629 B2 Page 1 of 1
APPLICATION NO. : 11/467564
DATED : December 23, 2008
INVENTOR(S) : Chih-Chang Chien It is certified that error appears in the above-identified patent and that said Letters Patent is hereby corrected as shown below:

On the title page, item (73), correct the residence of the Assignee from "Tsin-Tien" to "Hsin-Tien"

Signed and Sealed this

Tenth Day of March, 2009

JOHN DOLL
*Acting Director of the United States Patent and Trademark Office*